United States Patent
Kuzmin et al.

(10) Patent No.: US 11,646,193 B2
(45) Date of Patent: *May 9, 2023

(54) MANUFACTURING OF FOREIGN OXIDE OR FOREIGN NITRIDE ON SEMICONDUCTOR

(71) Applicant: Turun Yliopisto, Turku (FI)

(72) Inventors: Mikhail Kuzmin, St. Petersburg (RU); Pekka Laukkanen, Turku (FI); Yasir Muhammad, Turku (FI); Marjukka Tuominen, Rasio (FI); Johnny Dahl, Turku (FI); Veikko Tuominen, Turku (FI); Jaakko Makela, Turku (FI); Marko Punkkinen, Turku (FI); Kalevi Kokko, Turku (FI)

(73) Assignee: TURUN YLIOPISTO, Turku (FI)

( * ) Notice: Subject to any disclaimer, the term of this patent is extended or adjusted under 35 U.S.C. 154(b) by 0 days.

This patent is subject to a terminal disclaimer.

(21) Appl. No.: 16/707,090

(22) Filed: Dec. 9, 2019

(65) Prior Publication Data

US 2020/0111662 A1 Apr. 9, 2020

Related U.S. Application Data

(63) Continuation of application No. 15/505,892, filed as application No. PCT/FI2016/050101 on Feb. 17, 2016.

(30) Foreign Application Priority Data

Apr. 16, 2015 (FI) .................... 20155284

(51) Int. Cl.
    *H01L 21/02* (2006.01)

(52) U.S. Cl.
    CPC .... *H01L 21/02164* (2013.01); *H01L 21/0217* (2013.01); *H01L 21/0223* (2013.01);

(Continued)

(58) Field of Classification Search
    CPC ............ H01L 29/518; H01L 21/02164; H01L 21/0217; H01L 21/02172; H01L 21/02178;

(Continued)

(56) References Cited

U.S. PATENT DOCUMENTS

| | | | |
|---|---|---|---|
| 6,352,942 B1 | 3/2002 | Luan et al. | |
| 8,124,513 B2 | 2/2012 | Lin | |
| 9,722,026 B2 | 8/2017 | Toriumi et al. | |
| 2005/0000566 A1 | 1/2005 | Posthuma et al. | |

(Continued)

FOREIGN PATENT DOCUMENTS

| | | |
|---|---|---|
| CN | 101454881 A | 6/2009 |
| CN | 101840863 A | 9/2010 |

(Continued)

OTHER PUBLICATIONS

Jimenez, Original and English translation of "Si-indiffusion and O-outdiffusion processes at Si/SiO2/GaAs-oxides/GaAs structures: Implications in SiO2 formation and GaAs regrowth," Journal of Vacuum Science & Technology B 12, 3095. (Year: 1994).*

(Continued)

*Primary Examiner* — Xia L Cross
(74) *Attorney, Agent, or Firm* — Tarolli, Sundheim, Covell & Tummino LLP (57) ABSTRACT

A method for forming a foreign oxide or foreign nitride layer (6) on a substrate (1) of a semiconductor comprises providing a semiconductor substrate (1) having an oxidized or nitridized surface layer (3), supplying a foreign element (5) on the oxidized or nitridized surface layer; and keeping the oxidized or nitridized surface layer (3) at an elevated temperature so as to oxidize or nitridize at least partially the (Continued)

foreign element by the oxygen or nitrogen, respectively, initially present in the oxidized or nitridized surface layer (3).

10 Claims, 5 Drawing Sheets

(52) U.S. Cl.
CPC .. *H01L 21/02172* (2013.01); *H01L 21/02178* (2013.01); *H01L 21/02181* (2013.01); *H01L 21/02244* (2013.01); *H01L 21/02247* (2013.01); *H01L 21/02255* (2013.01)

(58) Field of Classification Search
CPC ........... H01L 21/02181; H01L 21/0223; H01L 21/02244; H01L 21/02247; H01L 21/02255
USPC ........................................................ 257/288
See application file for complete search history.

(56) References Cited

U.S. PATENT DOCUMENTS

| | | | | |
|---|---|---|---|---|
| 2005/0082533 | A1* | 4/2005 | Abe | H01L 29/66757 257/72 |
| 2007/0170541 | A1* | 7/2007 | Chui | H01L 29/517 257/506 |
| 2009/0197403 | A1 | 8/2009 | Honda | |
| 2014/0120738 | A1 | 5/2014 | Jung et al. | |
| 2014/0124842 | A1 | 5/2014 | Wang et al. | |
| 2014/0179095 | A1 | 6/2014 | Niyogi et al. | |
| 2014/0363120 | A1 | 12/2014 | Stephens et al. | |
| 2015/0037930 | A1 | 2/2015 | Chen | |

FOREIGN PATENT DOCUMENTS

| | | |
|---|---|---|
| EP | 2843706 | 3/2015 |
| JP | 62-136036 S | 6/1987 |
| JP | 1-220834 H | 9/1989 |
| JP | 8-2014168 H | 8/1996 |
| JP | H08288283 A | 11/1996 |
| JP | 2010-045254 A | 2/2010 |
| JP | 2010-219536 A | 9/2010 |
| JP | 2011-151228 A | 8/2011 |
| TW | 201425633 A | 7/2014 |
| WO | 2012/062966 A1 | 5/2012 |
| WO | 2015/029535 A1 | 3/2015 |

OTHER PUBLICATIONS

Minami et al., "Low-Temperature Reduction of Ge Oxide by Si and SiH4 in Low-Pressure H2 and Ar Environment," 7th International Silicon-Germanium Technology and Device Meeting (ISTDM)(2014).
Minami et al., "Low-temperature reduction of Ge oxide by Si and SiH4 in low-pressure H2 and Ar environment," 110 Solid State Electronics 40 (2015).
Jimenez et al., "Si-indiffusion and O-outdiffusion processes at Si/SiO2/GaAs-oxides/GaAs structures: Implications in SiO2 formation and GaAs regrowth," 12 J. Vac. Sci. Technol. B: Microelectronics Processing and Phenomena 3095 (1994).
Yang et al., Interface control of Gd2O3/GaAS system using pre-deposition of Gd metal on GaAs substrate with native oxides, 420-21 Thin Solid Films 571 (2002).
Suri et al., "Interfacial self cleaning during atomic layer deposition and annealing of Hf02 films on native (100)-GaAs substrates," 96 Applied Physics Letters 112905 (2010).
Hudait et al., "Energy band alignment of atomic layer deposited HfO on epitaxial (110)Ge grown by molecular beam epitaxy," 102 Applied Physics Letters 093109 (2013).
Xiang et al., "Effect of precursor entrance sequence during atomic layer deposition on the Al2O3/Ge interface by X-ray photoelectron spectroscopy," 58 ECS Transactions 153 (2013).
Norton et al., "Hydrogen-assisted pulsed-laser deposition of (001)CeO2 on (001) Ge," 76 Applied Physics Letters 1677 (2000).
McIntyre et al., "Interface Studies of ALD-grown metal oxide insulators on Ge and III-V semiconductors (Invited Paper)," 86 Microelectronic Engineering 1536 (2009).
Ruterana et al., "High resolution electron microscopy of the GaAs/Si3N4 interface produced by multipolar plasma deposition," 49 Applied Physics Letters 672 (1986).
Robertson et al., "High-K materials and metal gates for CMOS applications," 88 Materials Sci. & Engineering R 1 (2014).
Konda et al., "Effect of pulsed deposition of Al2O3 for native oxides reduction of GaAs by atomic layer deposition technique," 30 J. Vac. Sci. Technol. A 01A118-1 (2012).
Flamand et al., Towards highly efficient 4-terminal mechanical photovoltaic stacks, 19 III-Vs Review 24 (2006).
Windl et al., "Modeling and Characterization of Atomically Sharp "Perfect" Ge/SiO2 Interfaces," 114-115 Materials Sci. & Eng.: B 156 (2004).
Second Written Opinion in PCT/FI2016/050101.
Office Action dated Mar. 23, 2022 for the corresponding Taiwanese patent application 105105856.

* cited by examiner

Figure 5

MANUFACTURING OF FOREIGN OXIDE OR FOREIGN NITRIDE ON SEMICONDUCTOR

TECHNICAL FIELD

The present invention relates to semiconductor structures and devices, in particular to structures and devices comprising an oxide-semiconductor or nitride-semiconductor interface, and to manufacturing of such structures and devices.

BACKGROUND

Various semiconductor devices, such as, for example, light emitting diodes LEDs, semiconductor lasers, photodetectors, photovoltaic cells, and transistors, comprise one or more oxide-semiconductor or nitride-semiconductor interfaces. The purpose of an oxide or nitride layer often relates to passivation and/or electrical insulation of the underlying semiconductor surface.

In various types of devices having such oxide-semiconductor or nitride-semiconductor interface, the quality of the material interface between the semiconductor and the oxide or nitride is of crucial importance for the performance of the device. Generally, a chemically abrupt interface with low density of defects in the semiconductor surface is desired. High density of defect states may result in harmful effects, such as increased leak current of the device. In the case of an oxide, defect states may be caused, for example, by oxidation of the semiconductor surface. Defect states induced by oxidation may relate e.g. to vacancies, dangling bonds and different oxide phases.

In the case of an oxide as the passivation or insulation material, conventionally, silicon dioxide $SiO_2$ has been extensively used as a passivation layer material for silicon as the semiconductor material. Its use for other semiconductors such as germanium Ge and group III-V compound semiconductors has also been investigated widely.

In one known approach exemplified e.g. by US 2005/0000566 A1, the semiconductor Ge surface on which an oxide layer is to be deposited is first cleaned from all oxide. Thereafter, an amorphous silicon layer is deposited on the cleaned semiconductor surface in order to avoid the substrate oxidation. A $SiO_2$ passivation layer is then formed on the amorphous Si layer. Another example of utilizing an initial Si layer on a Ge surface is disclosed in U.S. Pat. No. 6,352,942 B1. In the proposed approach, silicon can be deposited on the surface in a Ge growth chamber initially after growth of a Ge layer forming the surface layer of the substrate. Alternately, native oxides can be removed from the Ge surface before depositing the silicon layer. The silicon layer is exposed to dry oxygen gas at an elevated temperature for a time selected to oxidize only a portion of the initial Si layer.

In the above prior art examples, the silicon layer is in contact with the pure germanium surface. Such interaction may result in another undesired effect where silicon atoms diffuse into the Germanium crystal, leading to diffused (extended) interface. This may again result in harmful defect states negatively affecting the interface quality and consequently the performance of a device incorporating the passivated germanium surface.

The above phenomena are not limited to silicon dioxide and germanium as the oxide and the semiconductor materials, respectively. Instead, it is believed that those are generic phenomena possible for a plurality of material combinations. For example, corresponding phenomena may exist for a nitride as the passivation or insulation material on a semiconductor substrate.

To summarize, there is a need for a generic solution to produce high quality oxide-semiconductor and nitride-semiconductor interfaces which can be manufactured cost-efficiently at an industrial level.

SUMMARY

In one aspect, a method may be implemented for forming a foreign oxide layer or a foreign nitride layer on a semiconductor substrate. By a semiconductor substrate is meant here a substrate having a surface, at least part of which is formed of a semiconductor material. Such semiconductor material may form a layer lying on a body or a support portion of the semiconductor substrate, such body or support portion being formed of some other material. Alternatively, the semiconductor material may cover the entire thickness of the semiconductor substrate.

The semiconductor substrate may be a stand-alone body, structure, or element. Alternatively, it may form an integral part of a larger structure or device. For example, it may form a part of a structure of an optoelectronic device, a transistor, or any other device or component where a semiconductor-oxide interface or a semiconductor-nitride interface, preferably of high quality, is needed.

The semiconductor substrate may be formed and prepared by any appropriate method. Just as one example, a semiconductor substrate may be formed by depositing, for example by means of molecular beam epitaxy MBE, a layer of a III-V compound semiconductor on a sapphire deposition substrate.

"Foreign" oxide or nitride refers here to oxidized or nitridized material, respectively, which is different from the oxide(s) or nitride(s) the semiconductor material of the semiconductor substrate itself may form.

The semiconductor material may be a single-element semiconductor material comprising just one semiconductor element, such as germanium Ge. Alternatively, or in addition to, it may also comprise a compound semiconductor material, such as gallium arsenide GaAs, indium arsenide InAs, indium gallium arsenide InGaAs, indium phosphide InP, aluminum gallium antimonide AlGaSb, indium antimonide InSb, or any other compound semiconductor materials known in the art. In both cases, the semiconductor material may be doped or intrinsic.

The method comprises providing a semiconductor substrate having an oxidized or nitridized surface layer; supplying at least one foreign element on the oxidized or nitridized surface layer; and keeping the oxidized or nitridized surface layer at an elevated temperature so as to oxidize or nitridize at least partially the supplied foreign element by the oxygen or nitrogen, respectively, initially present in the oxidized or nitridized surface layer.

The oxidized or nitridized surface layer means a layer formed by an oxide or a nitride of the semiconductor material of the semiconductor substrate. The oxidized or nitridized surface layer may cover only a part of the thickness of the semiconductor material. Alternatively, the entire thickness of the semiconductor material may be oxidized or nitridized, thereby forming the oxidized or nitridized surface layer.

Said "providing" the semiconductor substrate with an oxidized or nitridized surface layer may comprise just receiving a complete semiconductor substrate having such oxidized or nitridized surface layer. Alternatively, forming such oxidized or nitridized surface layer may be a part of the method.

In itself, the semiconductor material may be crystalline. However, oxides and nitrides of intrinsically crystalline semiconductor materials are typically amorphous. Therefore, the oxidized or nitridized surface layer may be amorphous also when the oxidized or nitridized surface layer lies on a crystalline semiconductor layer.

The foreign element may be, in principle, any material capable of forming an oxide or a nitride layer on the semiconductor substrate. The primary physical requirement is that the heat of formation per an oxygen or nitrogen atom of an oxide or a nitride of the foreign element is higher than the heat of formation per an oxygen or a nitrogen atom of the semiconductor oxide or nitride of the oxidized or nitrided surface layer. Such foreign element oxides and nitrides are typically dielectric materials which can be used to passivate and/or electrically insulate various semiconductor surfaces. Therefore, the foreign oxide or nitride layer can be considered generally as a dielectric layer comprising a foreign oxide or foreign nitride. The foreign element may be some semiconductor or metal, for example, silicon or aluminum, respectively. Other examples of metals for the foreign element are hafnium and barium.

Said oxidizing or nitridizing the foreign element by the oxygen or nitrogen initially present in the oxidized or nitridized surface layer may take place substantially simultaneously with supplying the foreign element on the oxidized or nitridized surface layer. In other words, the semiconductor substrate may be kept at an appropriately elevated temperature during supplying the foreign element on the oxidized or nitridized surface layer thereof, whereby the supplied foreign element and the oxygen or nitrogen may directly form a layer of a foreign oxide or a foreign nitride. Said elevated temperature can be selected to be sufficiently high above the normal room temperature so that the oxygen or nitrogen initially bound in the oxidized or nitridized surface layer is disentangled from the substrate semiconductor and diffuses towards the transient layer and reacts with the foreign element thereof, thereby forming an oxide or a nitride of the foreign element. The required temperature level depends on the material(s) of the semiconductor substrate and the foreign element.

In an embodiment, the method comprises forming a transient layer by depositing the foreign element on the oxidized or nitridized surface layer; and heat-treating the oxidized or nitridized surface layer and the transient layer thereon so as to oxidize or nitridize at least partially the transient layer by the oxygen or nitrogen, respectively, initially present in the oxidized or nitridized surface layer.

Thus, in this embodiment, after formation of the transient layer by supplying the foreign element on the oxidized or nitridized surface layer, there is a temporary structure effectively comprising a layered stack of the semiconductor substrate, the oxidized or nitridized surface layer thereof, and the transient layer on the oxidized or nitridized surface layer. This stack may be exposed to a heat treatment where the temperature of the oxidized surface layer and the transition layer of the foreign element is heated to a sufficiently high temperature so that the oxygen initially bound in the oxidized surface layer is disentangled from the substrate semiconductor and diffuses towards the transient layer and reacts with the foreign element thereof, thereby forming an oxide of the foreign element. The heat treatment is preferably carried out in vacuum conditions to prevent any external impurities from affecting the oxidation or nitridation of the foreign element. During the formation of the transient layer, the substrate may be kept at any appropriate temperature which may be, for example, substantially lower than the temperature of the oxidized or nitridized surface layer during the heat treatment.

In the above embodiment, the transient layer formation and the oxidation or nitridation of the foreign element may thus take place separately in time.

The transient layer may also be formed so as to comprise more than one foreign element. Therefore, "depositing a foreign element" shall be understood as meaning deposition of at least one foreign element. In the case of more than one foreign element, in said oxidation or nitridation of the transient layer, oxides or nitrides of different foreign elements, or an alloy oxide or nitride of several foreign elements, may form.

Correspondingly, the semiconductor material may generally comprise any semiconductor material on which a foreign oxide layer may be formed. Examples are germanium and III-V compound semiconductors, i.e. compound semiconductors formed of the group III and V elements. One example of the latter, commonly used, for example, in high speed electronics and high-end photodiodes, is gallium arsenide GaAs.

In supplying the foreign element on the oxidized or nitridized surface layer, any deposition method known in the art, such as sputtering, evaporation, or atomic layer deposition, may be used. In the case of forming a transient layer on an oxidized surface layer, the deposition is preferably carried out in non-oxidizing conditions, i.e. in vacuum or with a low amount of external oxygen present, to prevent oxidation of the foreign element at this stage.

Alternatively, the substrate with the oxidized surface layer thereon may be kept at such high temperature during the formation of the transient layer, whereby said disentangling and diffusing of the oxygen as well as the reaction thereof with the foreign element may start already during the transient layer formation. Thus, in this approach, the heat-treatment may be carried at least partially simultaneously with the transient layer formation.

Thus, in all embodiments above, an appropriate heat treatment at an elevated temperature can cause the diffusion of the oxygen or nitrogen in the oxidized or nitridized surface layer of the semiconductor substrate towards the foreign element supplied on the surface of the oxidized or nitridized surface layer, possibly forming a transient layer. Thereby, all or part of the supplied foreign element may be converted into the foreign oxide or foreign nitride layer. Thus, a single heat treatment may serve for both removing the oxygen or nitrogen, i.e. the harmful oxidized or nitridized surface layer, from the substrate, and transforming at least part of supplied foreign element, possibly forming a transient layer, into the foreign oxide or foreign nitride layer. Consequently, a high quality, chemically abrupt interface may result between the possibly crystalline semiconductor surface and the foreign oxide or foreign nitride layer. Advantageously, such high-quality interface may be achieved in a well-controlled, cost-effective process.

The "elevated" or "high" temperature required to initiate said decomposing of the initial oxide or nitride of the semiconductor, and to form the oxide or nitride of the foreign element, depends on the materials used. This temperature shall be sufficiently high to provide the oxygen or nitrogen atoms bound in the semiconductor oxygen with an energy exceeding the potential barrier binding the semiconductor and the oxygen or nitrogen together.

In an embodiment, the elevated temperature is equal to or higher than 300° C. Such high temperatures may provide efficient formation of the oxide or nitride for various combinations of the substrate and foreign element materials, such as for germanium and silicon, respectively.

The "elevated temperature" may be also clearly higher than 300° C. For example, in the case in which an amorphous silicon transient layer is deposited on an oxidized germanium surface, temperature of about 600° C. may be appropriate. The temperature should not be too high, although, to avoid decomposition of the semiconductor and the foreign oxide or foreign nitride materials. For example, silicon dioxide $SiO_2$ decomposes in temperatures exceeding 900° C. On the other hand, in the case in which GaAs is used as the semiconductor material of the semiconductor substrate, the maximum temperature should be below about 700° C. to avoid decomposition of GaAs.

The duration of the heat treatment or, in general, keeping the oxidized or nitridized surface layer at an elevated temperature, may vary according to the materials and layer thicknesses used. It may be in the range of minutes, for example, 5 to 20 minutes.

In supplying the foreign element, e.g. by forming the transient layer, the amount of the supplied foreign element or the thickness of the transient layer formed may be adjusted according to the thickness of, and the amount of oxygen or nitrogen contained in, the oxidized or nitridized surface layer of the semiconductor substrate. In other words, amount of the supplied foreign element or the transient layer thickness may be selected so that, taking into account the stoichiometry of the foreign element oxide or nitride to be formed, there are sufficient foreign element atoms to ensure that in the oxidation or nitridation process, all or at least most of the oxygen or nitrogen in the oxidized or nitridized surface layer of the substrate can be consumed in the oxidation or nitridation process.

On the other hand, the amount of the supplied foreign element may exceed the amount required by the stoichiometry conditions. It has been found, for example, that formation of the foreign oxide may start at the side of the transient layer adjacent to the oxidized surface layer of the semiconductor substrate. Thereby, a protective foreign oxide layer may form at an early stage between the transient layer and the oxidized surface layer of the semiconductor substrate, preventing the diffusion of the foreign element atoms into the semiconductor even if there is an excess amount of the foreign element. The rest of the foreign element, not oxidized by the oxygen initially contained in the oxidized surface layer, may be then oxidized by means of external oxygen.

In an embodiment for forming a foreign oxide layer on a semiconductor substrate, the oxidized surface layer may comprise native oxide. In this embodiment, there is no need for any specific oxidation of the semiconductor surface; the semiconductor substrate may be simply exposed to ambient air for a period sufficient for the native oxide layer to form. Typically, native oxide formation on a semiconductor surfaces saturates so that a material-specific native oxide thickness is formed.

The oxidized or nitridized surface layer may be also formed by a specific oxidation or nitridation process, in which case providing a semiconductor substrate having an oxidized or nitridized surface layer may comprise, for example, cleaning a surface of a semiconductor substrate, and oxidizing or nitridizing the thereby cleaned surface. By forming the oxidized or nitridized surface layer by a controlled oxidation or nitridation process, the thickness and the properties thereof may be adjusted more easily than in the case of a native oxide. Such cleaning and oxidation or nitridation processes may be carried out according to principles and equipment as such known in the art.

In one aspect, a method may be implemented for forming a semiconductor device, wherein the method comprises forming a foreign oxide layer or a foreign nitride layer on a semiconductor substrate according to any of the embodiments discussed above. Thus, in this aspect, a method may comprise formation of a complete, operable semiconductor device. Such device may be, for example, a light emitting diode LED, a photodiode, a semiconductor laser, a photovoltaic (solar) cell, or any other optoelectronic device. It may be also any type of transistor, such as a metal-oxide-semiconductor field-effect transistor MOSFET or any other type of field-effect transistor, or a high-electron-mobility transistor HEMT. In addition to MOSFET, the device may also be any other building block of complementary metal oxide semiconductor CMOS circuits. As some specific examples, the method can be used for manufacturing a germanium-based or gallium arsenide-based infrared photodiode or a metal-oxide-semiconductor capacitor MOSCAP. Yet further semiconductor device examples are capacitors, diodes, fuses, flash memory cells and circuits, and semiconductor photosynthetic cells. In general, the possible implementations of the method are not limited to the above examples only. Instead, the semiconductor device may be any device incorporating a semiconductor-oxide or semiconductor-nitride interface.

The semiconductor device may be formed as a discrete component or module. It may also be formed as an integral, inseparable part of a larger device, module, circuit, or assembly.

In a device aspect, a semiconductor structure may comprise a foreign oxide or foreign nitride layer formed on a semiconductor substrate by a method as defined above. The semiconductor structure may form a part of a semiconductor device comprising such semiconductor structure. Similarly to the method aspect discussed above, the semiconductor device may be, for example, one of a light emitting diode, a photodetector, a semiconductor laser, a photovoltaic cell, a transistor such as a metal-oxide-semiconductor field-effect transistor, a metal-oxide-semiconductor capacitor, a high-electron-mobility transistor, a flash memory cell or circuit, and a semiconductor photosynthetic cell.

In a semiconductor structure formed using the above method, an abrupt, high-quality interface with low defect density may be present between the semiconductor and the foreign oxide or foreign nitride layer. In particular, there may be clearly less foreign element atoms diffused into the semiconductor of the semiconductor substrate than in the case of a similar structure manufactured using any prior art process.

Further, in the case with silicon dioxide as the foreign oxide, as one unique feature produced by the above methods, the silicon +1 oxidation state may be substantially completely lacking in the foreign oxide layer. Thus, in the case of silicon as the foreign element and the substrate having initially an oxidized surface layer, a semiconductor structure may be manufactured comprising a foreign oxide which comprises silicon, the silicon dioxide being substantially free of +1 oxidation states. The lack of +1 oxidation states indicates a chemically abrupt, well defined interface between the silicon dioxide and the substrate.

BRIEF DESCRIPTION OF THE DRAWINGS

In the following, some embodiments are described with reference to the accompanying drawings, wherein.

DETAILED DESCRIPTION

Figure 1:
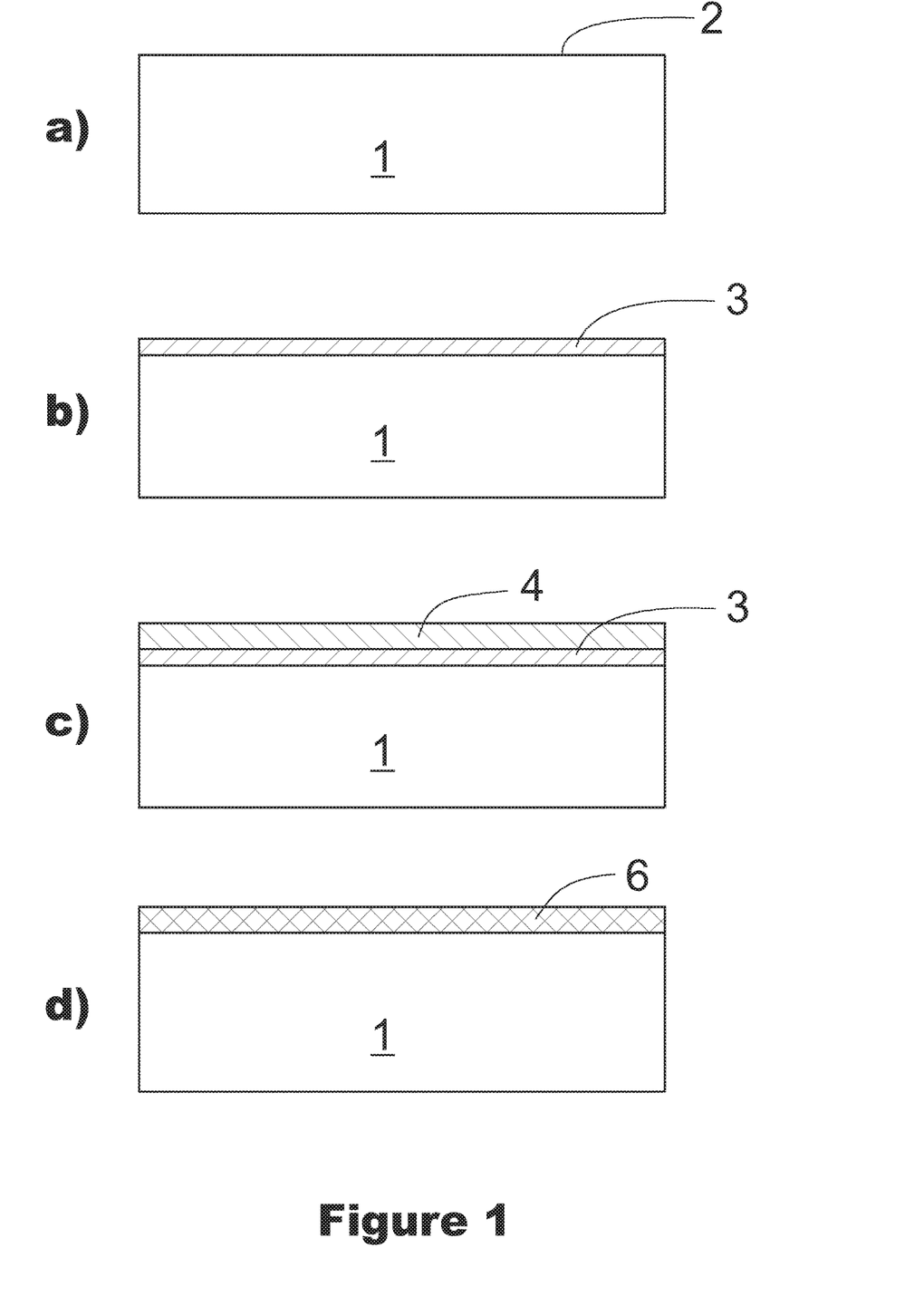
FIGS. 1 and 2 are schematic illustrations of the steps of methods in accordance with the invention.

In the method illustrated in FIG. 1, a semiconductor substrate 1 is first provided in step a). In this example, the semiconductor substrate 1 is illustrated as a stand-alone substrate element being entirely formed of a semiconductor material. Alternatively, a semiconductor substrate could have a semiconductor material layer lying on a support layer of some other material. A semiconductor substrate as illustrated in FIG. 1 could also form an integral part of a larger device or structure.

Possible semiconductor materials of the semiconductor substrate are, for example, doped and un-doped germanium Ge and III-V compound semiconductors, such as gallium arsenide GaAs, indium gallium arsenide InGaAs, indium arsenide InAs, indium antimonide InSb and aluminum indium phosphide AlInP.

Said "providing" may comprise just receiving or having the semiconductor substrate which has been formed previously. Alternatively, forming the semiconductor substrate may be an integral part of the method. For example, providing the semiconductor substrate may comprise depositing it by molecular beam epitaxy MBE in vacuum conditions.

The substrate has a top surface 2 to be coated/insulated/passivated by a dielectric oxide or nitride of a foreign element, i.e. an element different from the element(s) of the substrate. The foreign element may be, for example, silicon or aluminum, the oxide or nitride then being, for example, silicon dioxide $SiO_2$ or silicon nitride SiN or $Si_3N_4$ for silicon, or aluminum oxide $Al_2O_3$ or aluminum nitride AlN for aluminum as the foreign element.

"Top" is used here just to refer to the location of the surface at issue at the top of the semiconductor substrate in the drawing of FIG. 1, without binding the position of the substrate in any specific coordinates. Thus, it does not limit the positioning of such surface in reality: naturally, the substrate may be kept in positions where the surface thereof to be coated by the foreign oxide may face to any direction and may be even, for example, a bottom surface of the substrate.

In step b), the top surface 2 of the semiconductor substrate formed in step a) is oxidized or nitridized so that an oxidized or nitridized surface layer 3 is formed on top of the semiconductor substrate. The oxidized or nitridized surface layer thus comprises oxide(s) or nitride(s) of the semiconductor material. Oxidation may be carried out simply by exposing the top surface to an ambient atmosphere where oxygen is present, thereby letting a native oxide layer form on the top surface. Alternatively, the top surface may be first cleaned from possible oxides and impurities, for example, chemically or, in the case of germanium as the semiconductor material, by argon ion sputtering or hydrogen exposure which may be followed by post heating in ultrahigh vacuum conditions. Details of those cleaning processes are well known in the art. After cleaning, the top surface may be oxidized or nitridized in a controlled manner according to processes and principles as such known in the art. Naturally, oxidation or nitridation may also be carried out directly after formation of the semiconductor substrate e.g. by means of MBE, in which case separate cleaning may be not necessary.

Thus, after step b), a semiconductor substrate with an oxidized or nitridized surface layer is provided.

In step c), a foreign element 5 is deposited, preferably in non-oxidizing conditions, on the oxidized or nitridized surface layer 3, thereby forming a transient layer 4 on top of the structure. The deposition may be carried out by, for example, sputtering, evaporation, or atomic layer deposition. The deposition process details may be selected according to the principles, and by means of equipment, which are as such known in the art. Preferably, a layer with substantially uniform thickness is formed. During the deposition, the semiconductor substrate may be kept at room temperature. In some other cases, the substrate may be heated or cooled above or below the room temperature, respectively. The non-oxidizing conditions mean that the deposition may be carried out in vacuum or with a low oxygen partial pressure present.

The transient layer thickness and the foreign element amount contained therein may be adjusted according to the amount of oxygen or nitrogen present in the oxidized or nitridized surface layer 3. In other words, the amount of the foreign element in the transient layer may be set to equal to or exceed the amount, as calculated on the basis of the stoichiometry of the foreign element oxide or nitride to be formed, corresponding to the oxygen or nitrogen amount in the oxidized or nitridized surface layer.

The stack of the substrate with the oxidized or nitridized surface layer thereof and the transient layer of the foreign element is annealed, i.e. exposed to a heat treatment at an elevated temperature which is sufficiently high to initiate decomposition of the oxidized or nitridized surface layer and to initiate diffusion of the oxygen or nitrogen atoms. It has been observed by the inventors that the oxygen or nitrogen atoms from the semiconductor oxide or nitride may diffuse towards the foreign element atoms of the transient layer and react with them, thereby forming oxide or nitride of the foreign element. The heat treatment is preferably continued as long as all the semiconductor oxide or nitride of the oxidized or nitridized surface layer is decomposed. Typical duration of the heat treatment may be, for example, 5 to 30 minutes.

Thus, as a consequence of the annealing, as illustrated by step d) in FIG. 1, the oxidized or nitridized surface layer of the semiconductor substrate and the transient layer thereon may be converted into a pure semiconductor substrate 1 and a foreign oxide or nitride layer 6 thereon. Advantageously, it has been observed by the inventors that it is thereby possible to achieve a high quality, chemically abrupt interface between the semiconductor and the oxide or nitride of the foreign element.

In the above, the method has been discussed at a general level with no connection to any concrete device. However, it is to be noted that the above process may be used to form a foreign oxide layer on a semiconductor substrate, wherein the substrate and the oxide or nitride layer may form a part of any semiconductor device where a high quality foreign oxide-semiconductor or nitride-semiconductor interface is needed. In this sense, the above method may form a part of a method for forming a complete, operable semiconductor device. Correspondingly, the structure illustrated in FIG. 1 may be considered illustrating a semiconductor device or a part thereof.

Such semiconductor device may be, for example, a light emitting diode, a photodiode, a semiconductor laser, a photovoltaic cell, a metal-oxide-semiconductor field-effect transistor or some other building block of complementary metal oxide semiconductor CMOS circuits, a high-electron-mobility transistor, or any other electronic component with a foreign oxide-semiconductor interface. As one specific example of photovoltaics, not limiting the scope of possible applications, the method can be used to form a passivating foreign oxide layer on a germanium bottom layer of a four-terminal mechanical photovoltaic stack having a III-V top layer. An example of the general structure of a four-terminal mechanical photovoltaic stack is disclosed in Flamand et al, "Towards highly efficient 4-terminal mechanical photovoltaic stacks", Science Direct, III-Vs Review, Vol. 19, Issue 7, September-October 2006, pp 24-27. The top layer of such stack could be passivated, for example, by a method disclosed in WO 2012/062966 A1.

Figure 2:
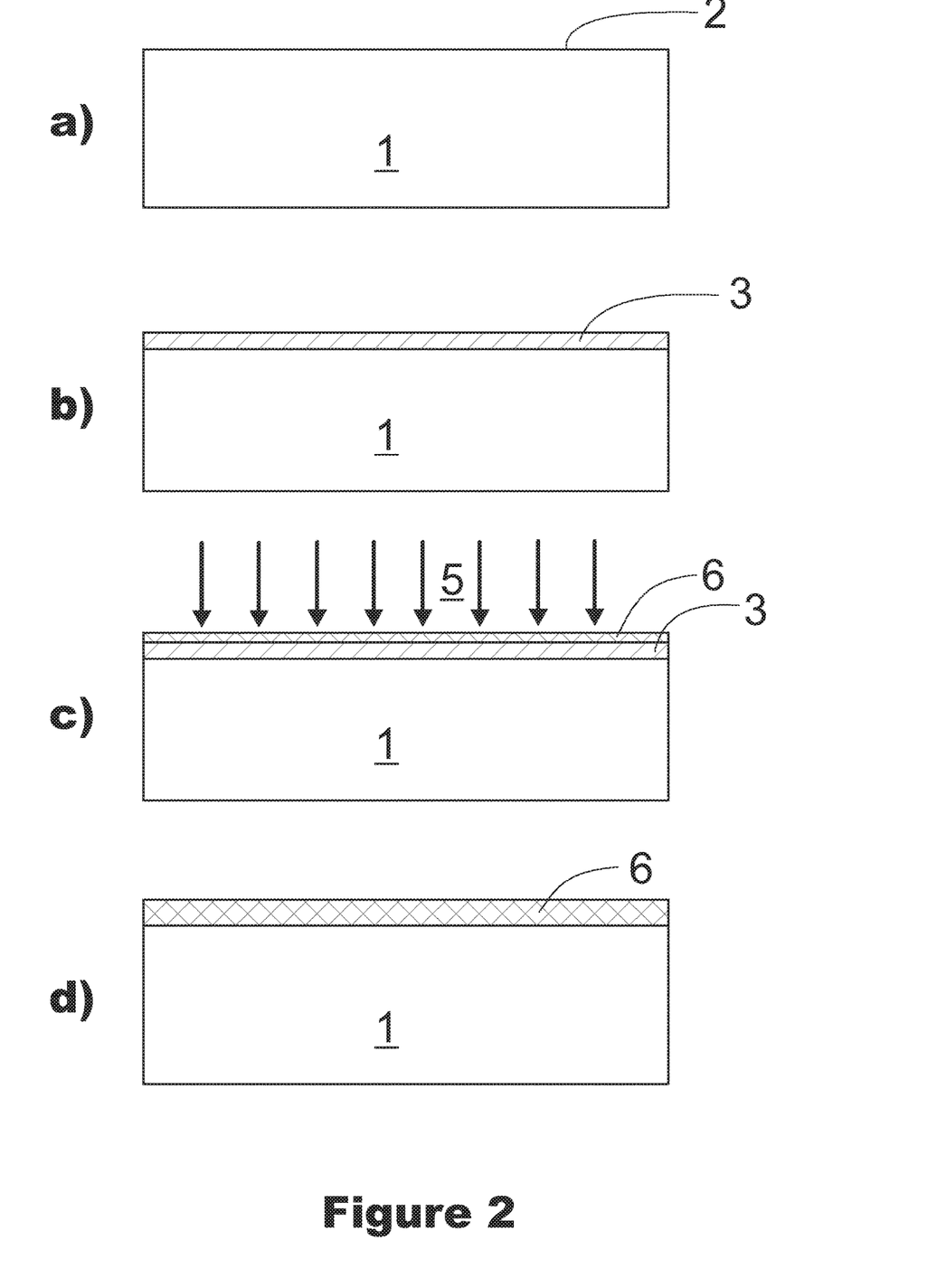

The process of FIG. 2 differs from that of FIG. 1 in that no separate transient layer is formed. Instead, in step c), foreign element 5 is supplied on the surface of the oxidized or nitridized surface layer, as illustrated by the arrows marked in the drawing of FIG. 4, while keeping the semiconductor substrate and the surface layer thereon at a sufficient high temperature to initiate odixation or nitridation of the foreign element adsorbed on the surface layer. Thereby, formation of a foreign oxide or foreign nitride layer 6 at least starts already during the supply of the foreign element. Also in this case, the amount of the supplied foreign element atoms and the duration of keeping the semiconductor substrate at an elevated temperature may be selected so that all the semiconductor oxide or nitride of the oxidized or nitridized surface layer is decomposed. Finally, in step d), a foreign oxide or nitride layer 6 is formed on the semiconductor substrate 1 with a high quality, chemically abrupt interface therebetween.

Figure 3:
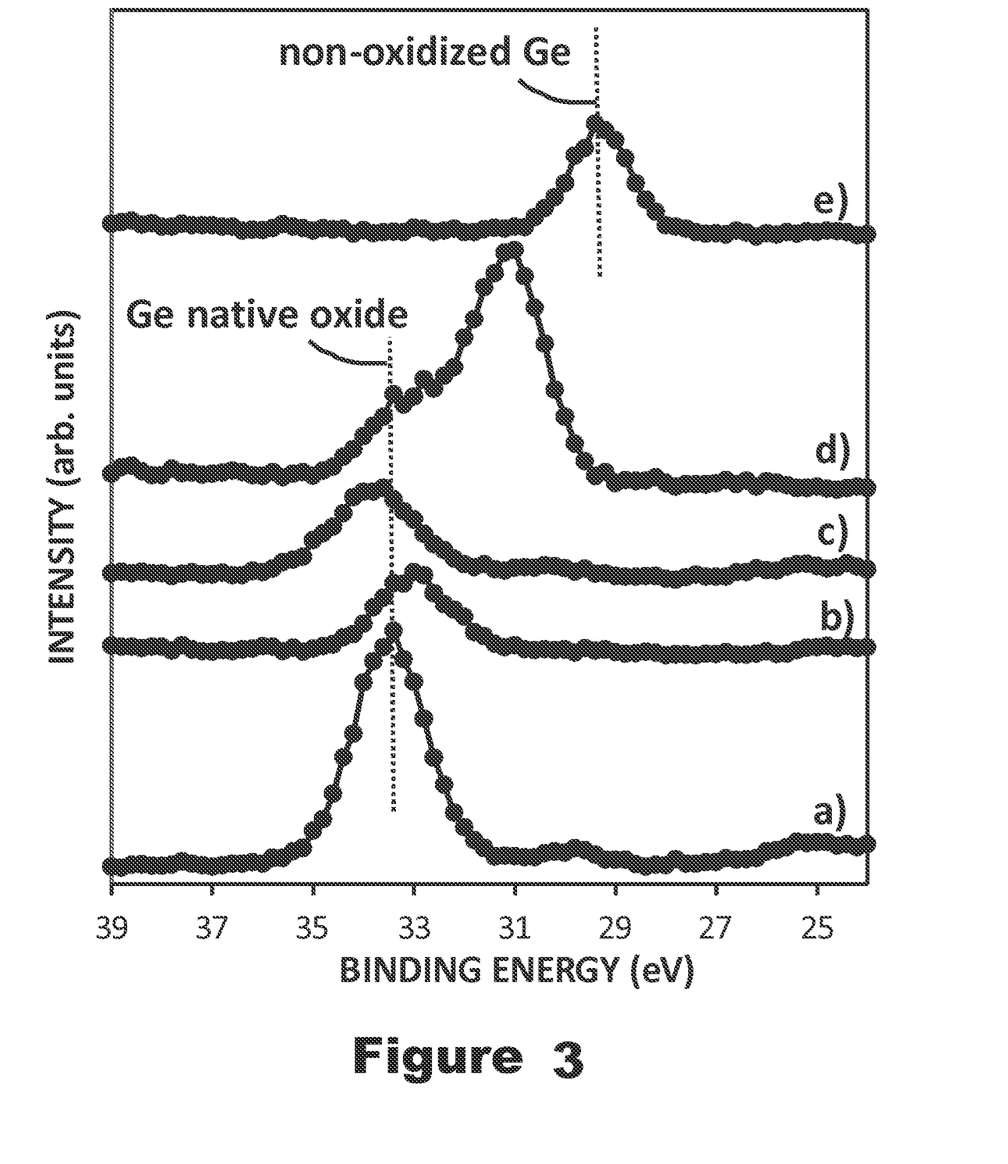
FIGS. 3 to 5 show measurements of test structures manufactured in accordance with the invention.

The principles of the method as discussed above were tested in practice. In one example, an amorphous silicon film as a transient layer was deposited on a naturally oxidized germanium (100) substrate, after which the structure was heated step by step up to 600° C. in vacuum. In the graph of FIG. 3, x-ray photoelectron spectra (XPS) of germanium 3d peak, measured between the heating/annealing steps, are shown.

The lowermost curve a) of the graph of FIG. 3 represents the spectrum measured from the sample with a native oxide layer thereon before heating. The next curve b) was measured from the sample after deposition of a Si transient layer with a thickness of 2.5 nm on the native oxide. Curve c) represents the spectrum after annealing the sample at 300° C. for 10 minutes. Curve d) was measured from the sample after annealing at 630° C. for 5 minutes. The uppermost curve represents measurements from the sample after deposition of a further 2.5 nm Si layer on the surface thereof. The measurements were performed in situ, i.e. without removing the sample from the vacuum chamber in which it was annealed.

In the lowermost curve a), the highest peak at the binding energy of about 33 eV results from germanium oxide. When the treatment proceeds, the peak position and shape shift clearly so that at step d) and finally at step e), the signal from Ge oxides has effectively disappeared. Instead, there is a clear peak in intensity from pure Ge crystal at about 29 eV. The spectrum after annealing at 630° C. corresponds well with the bulk spectrum of germanium. Thus, the change of the spectrum in result of heating the sample implies complete decomposition of the germanium oxide(s).

Other measurements were performed to confirm the formation of the silicon dioxide from the oxygen of the decomposed germanium oxide and the silicon of the amorphous silicon layer deposited initially on the oxidized germanium surface. Further, tests were carried out where similar Ge/SiO$_2$ samples were additionally annealed in oxygen atmosphere (dose 3000 Langmuir) at 300° C. The annealing did not change the germanium 3d spectrum, implying that the Ge substrate was not anymore oxidized during the additional annealing. Thus, the silicon dioxide effectively protects the underlying germanium surface, thereby preserving the chemical abruptness of the silicon dioxide-germanium interface.

Figure 4:
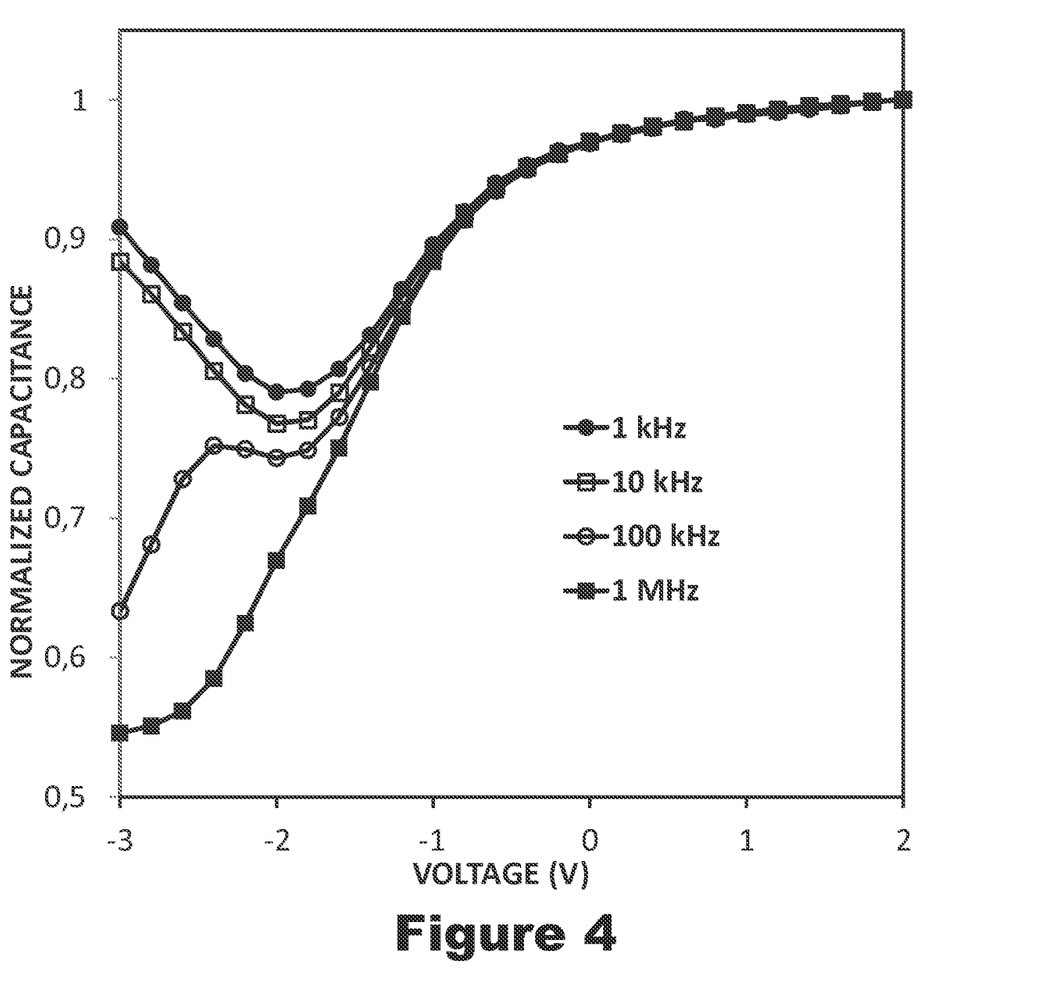

In another test example, a metal-oxide-semiconductor capacitor containing a SiO$_2$/Ge interface was manufactured. The SiO$_2$/Ge interface was prepared similarly to the previous examples, i.e. by forming a transient layer of silicon on an oxidized surface layer of the Ge substrate, and annealing the thereby formed layer stack. FIG. 4 represents capacitance-voltage curves measured from the sample for various frequencies. Capacitance modulation with the voltage supports the assumption of formation of a high quality SiO$_2$/Ge interface.

Figure 5:
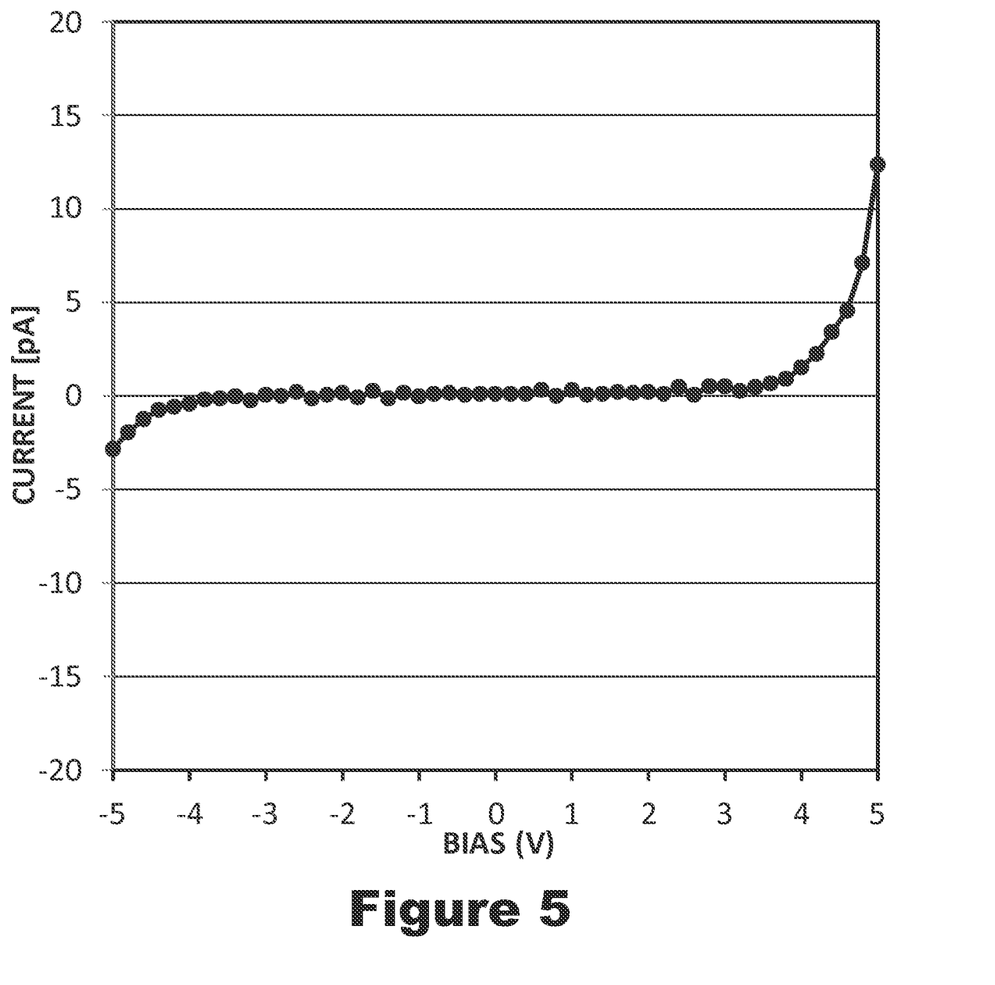

FIG. 5 shows the leakage current measured from the same sample as the capacitance-voltage curves of FIG. 4. The very low leakage current is a further evidence of the assumed formation of a high-quality SiO$_2$/Ge interface during the annealing of the germanium/germanium oxide/amorphous silicon stack.

In the above test examples, germanium and silicon were used as the semiconductor material and the foreign element of the foreign oxide layer, respectively. Other tests made with, for example, gallium arsenide GaAs as the semiconductor, support the applicability of the method for great variety of semiconductors, not only to Ge. In those tests, aluminum was used as one alternative to silicon as the foreign element. Therefore, the embodiments of the invention are not limited to any specific semiconductor and foreign element material or their combinations. In particular, although the above test examples concerned formation of a foreign oxide layer on a semiconductor substrate, similar or corresponding results are achievable also in the case of forming a foreign nitride layer on a semiconductor substrate.

In general, it is important to note that the above examples and embodiments do not limit the scope of possible embodiments of the inventions, but the embodiments may freely vary within the scope of the claims.

What is claimed is:

1. A method for forming a foreign oxide (6) on a semiconductor substrate (1), the method comprising:
   providing the semiconductor substrate (1) having an oxidized surface layer (3), the oxidized surface layer comprising a native oxide being formed from germanium of the semiconductor substrate;
   supplying a foreign element (5) on the oxidized surface layer, while the substrate is kept at room temperature, using a deposition method which is sputtering or evaporation; and
   keeping the oxidized surface layer at an elevated temperature so as to oxidize at least partially the supplied foreign element by oxygen, initially present in the oxidized surface layer (3),
   wherein the foreign element is silicon, and wherein the semiconductor substrate comprises germanium.

2. The method as defined in claim 1, wherein the method comprises: forming a transient layer (4) by depositing the foreign element on the oxidized surface layer; and heat-treating the oxidized surface layer (3) and the transient layer (4) thereon so as to oxidize at least partially the transient layer by the oxygen initially present in the oxidized surface layer.

3. The method as defined in claim 1, wherein the elevated temperature is equal to or higher than 300° C.

4. The method as defined in claim 1, wherein providing the semiconductor substrate having the oxidized surface layer comprises cleaning a surface of the semiconductor substrate and oxidizing the thereby cleaned surface.

5. A method for forming a semiconductor device, the method comprising forming the foreign oxide layer on the substrate of a semiconductor according to claim 1.

6. The method as defined in claim 5, wherein the semiconductor device is one of a light emitting diode, a photodetector, a semiconductor laser, a photovoltaic cell, a transistor such as a metal-oxide-semiconductor field-effect transistor, a metal-oxide-semiconductor capacitor, a high-electron-mobility transistor, and a semiconductor photosynthetic cell.

7. A semiconductor structure comprising the foreign oxide layer (6) formed on the semiconductor substrate (1) by the method as defined in claim 1.

8. The semiconductor structure as defined in claim 7 comprising the foreign oxide layer comprising silicon, the silicon dioxide being substantially free of +1 oxidation states.

9. A semiconductor device comprising the semiconductor structure as defined in claim 7.

10. The semiconductor device as defined in claim 9, wherein the semiconductor device is one of a light emitting diode, a photodetector, a semiconductor laser, a photovoltaic cell, a transistor such as a metal-oxide-semiconductor field-effect transistor, a metal-oxide-semiconductor capacitor, a high-electron-mobility transistor, and a semiconductor photosynthetic cell.

\* \* \* \* \*